(12) United States Patent
Ezuhara et al.

(10) Patent No.: US 7,229,571 B2
(45) Date of Patent: Jun. 12, 2007

(54) PHOSPHOR FOR WHITE LED AND A WHITE LED

(75) Inventors: Takayoshi Ezuhara, Tsukuba (JP); Susumu Miyazaki, Kitasoma-gun (JP); Kenji Toda, Niigata (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/412,270

(22) Filed: Apr. 14, 2003

(65) Prior Publication Data

US 2003/0227007 A1    Dec. 11, 2003

(30) Foreign Application Priority Data

Apr. 15, 2002    (JP) .............................. 2002-112068

(51) Int. Cl.
*C09K 11/59* (2006.01)
*H01L 33/00* (2006.01)

(52) U.S. Cl. ................... 252/301.4 F; 252/301.6 F; 257/98; 313/503

(58) Field of Classification Search .................. 257/98; 313/501, 503; 252/301.4 R, 301.4 F, 301.6 F
See application file for complete search history.

(56) References Cited

U.S. PATENT DOCUMENTS

| | | | | |
|---|---|---|---|---|
| 3,651,363 A | * | 3/1972 | Barry | .......................... 313/486 |
| 3,676,361 A | * | 7/1972 | Datta | .................... 252/301.4 F |
| 5,951,915 A | | 9/1999 | Hase et al. | |
| 6,093,346 A | * | 7/2000 | Xiao et al. | ............. 252/301.4 F |
| 6,234,648 B1 | * | 5/2001 | Borner et al. | ................ 362/235 |
| 6,278,135 B1 | * | 8/2001 | Srivastava et al. | ............ 257/98 |
| 6,299,338 B1 | * | 10/2001 | Levinson et al. | ........... 362/559 |
| 6,429,583 B1 | * | 8/2002 | Levinson et al. | ........... 313/503 |
| 6,469,322 B1 | * | 10/2002 | Srivastava et al. | ............ 257/89 |
| 6,580,097 B1 | * | 6/2003 | Soules et al. | ............... 257/100 |
| 6,586,882 B1 | * | 7/2003 | Harbers | ...................... 313/634 |
| 6,982,045 B2 | * | 1/2006 | Menkara et al. | ...... 252/301.4 F |
| 2001/0001207 A1 | | 5/2001 | Shimizu et al. | |
| 2002/0038861 A1 | * | 4/2002 | Toda et al. | ........... 252/301.4 F |

FOREIGN PATENT DOCUMENTS

| | | |
|---|---|---|
| EP | 0 972 815 A1 | 1/2000 |
| EP | 1 193 306 A2 | 4/2002 |
| GB | 1 509 119 A | 4/1978 |
| JP | 49-67892 * | 7/1974 |
| JP | 10-188649 * | 7/1998 |

(Continued)

OTHER PUBLICATIONS

Poort et al, "The Imfluence of the Host Lattice on the Luminescence or Divalet Europium", Jour. Lumines> 72-74, 1997, pp. 24 49.*

(Continued)

*Primary Examiner*—C. Melissa Koslow
(74) *Attorney, Agent, or Firm*—Sughrue Mion, PLLC

(57) ABSTRACT

An object of the present invention is to provide fluorescence showing a peak wavelength of excited spectrum within the wavelength range of from 350 to 500 nm and suitable for a white LED emitting yellow light, and a white LED comprising this fluorescence. This object achieved by phosphor for white. LED comprising a silicate fluorescent material and a borate fluorescent material.

3 Claims, 3 Drawing Sheets

FOREIGN PATENT DOCUMENTS

| | | |
|---|---|---|
| JP | 10-188649 A | 7/1998 |
| JP | 2001-214162 A | 8/2001 |
| WO | WO 01/89000 A1 | 11/2001 |
| WO | WO 01/93342 A1 | 12/2001 |

OTHER PUBLICATIONS

S. Poort et al., "The Influence of the host lattice on the luminescence of divalent europium", Journal of Luminescence 72-74, (1997), 247-249 with Abstract.

K. Toda et al., "Synthesis and Characterization of New Long Persistent Phosphor", Journal of the Ceramic Society of Japan, 110 [4], (2002), pp. 283-288 with Abstract.

H. Hata et al., "Syntheses and Magnetic Properties of $Eu_3B_2O_6$ and $Sr_3B_2O_6$", Mat. Bull. vol. 12, (1997), pp. 811-814.

Z. Wei et al., "Phase relations in the ternary system $SrO-TiO_2B_2O_3$", Journal of Alloys and Compounds 327, (2001), pp. L10-L13 with Abstract.

ICSD Collections Code 1894, Calcium borate, (Jan. 1, 1980; updated Nov. 2, 1987), pp. 1.

Y. Lin et al, "Preparation of a new long afterglow blue-emitting $Sr_2MgSi_2O_7$-based photoluminescent phosphor", Journal of Materials Science Letters, Chapman and Hall Ltd., London, GB, vol. 20, No. 16, Aug. 15, 2001, 1505-1506.

A. Diaz et al, "$EU^{2+}$ Luminiescence in the Borates $X_2Z(BO_3)_2$ (X=Ba, Sr; Z=Mg, Ca)" Chemistry of Materials, Amer. Chemical Soc., Washington, US, vol. 9, No. 10, Oct. 1997, 2071-2077.

\* cited by examiner

PHOSPHOR FOR WHITE LED AND A WHITE LED

FIELD OF THE INVENTION

The present invention relates to phosphor for white LED and a white LED.

BACKGROUND OF THE INVENTION

It is known that a white LED emitting light which looks white is composed of a light emitting diode emitting blue light and phosphor excited by this blue light to emit yellow light (including yellow green color and orange color). Since the wavelength range of blue light emitted from a light emitting diode is from 350 to 500 nm, phosphor excited by light having this wavelength range and emitting yellow fluorescence is used as phosphor for white LED. Therefore, desirable phosphor is phosphor that has a peak wavelength of excited spectrum within the wavelength range of from 350 to 500 nm, excites efficiently by light in this wavelength range and emits yellow fluorescence.

As the phosphor used for a white LED composed of a light emitting diode emitting blue light and fluorescence excited by this blue light to emit yellow fluorescence and showing a peak wavelength of excitation spectrum within the wavelength range of from 350 to 500 nm, Japanese Patent Application No. 2001-214162A, for example, suggests an oxynitride glass phosphor activated by europium (composition molar ratio: $CaO:Al_2O_3:SiO_2:AlN:Eu_2O_3=29.1:3.2:32.3:32.3:3.1$). This fluorescence shows a peak wavelength of excitation spectrum of 480 nm, within the wavelength range of from 350 to 500 nm, however, its peak wavelength of luminescence spectrum is 600 nm and it emits near red fluorescence. Therefore, when this phosphor is used for a white LED, the white LED emit slightly different form white light and this fluorescence is insufficient as the fluorescence for white LED.

As the other example of the phosphor used for a white LED, the compound represented by $(Y_{1-a}Gd_a)_3(Al_{1-b}Ga_b)_5O_{12}:Ce$ is practically used (Japanese Patent Application No. H10-242513A). Since the peak wavelength of luminescence spectrum contains the blue-green fluorescence having the wavelength of 480 nm with about 20% intensity of the emission, when this phosphor is combined with blue LED, this phosphor emit greenish yellow fluorescence and is insufficient as white LED.

SUMMARY OF THE INVENTION

An object of the present invention is to provide phosphor showing a peak wavelength of excitation spectrum within the wavelength range of from 350 to 500 nm, emitting yellow fluorescence, and the lower intensity of the blue-green fluorescence having the wave length of 480 nm than conventional one and suitable for a white LED, and a white LED comprising this fluorescence.

The present inventors have intensively studied the composition of phosphor for solving the above-mentioned problems under such conditions, and resultantly found that phosphor comprising at least one selected from the group consisting of a silicate fluorescent material and a borate fluorescent material show a peak wavelength of excitation spectrum in the wavelength range of from 350 to 500 nm, further, emits yellow fluorescence. Additionally, the present inventor found the said phosphor has lower intensity of the blue-green fluorescence having the wavelength of 480 nm than conventional one, and then completed the invention.

Namely, the present invention provides phosphor for white LED comprising at least one selected from the group consisting of a silicate fluorescent material and a borate fluorescent material. Also, the present invention provides the above-mentioned phosphor wherein the silicate fluorescent material comprises a composition represented by $mM^1O.nM^2O.2SiO_2$ (wherein, $M^1$ represents at least one selected from the group consisting of Ca, Sr and Ba, $M^2$ represents at least one selected from the group consisting of Mg and Zn, m is from 0.5 to 2.5 and n is from 0.5 to 2.5), and at least one activator selected from the group consisting of Eu and Dy. Further, the present invention provides the above-mentioned phosphor wherein the silicate fluorescent material has the same crystal structure as that of Akermanite The present invention further provides the above-mentioned phosphor wherein the borate fluorescent material comprises a composition represented by $sM^3O.tB_2O_3$ (wherein, $M^3$ represents at least one selected from the group consisting of Mg, Ca, Sr and Ba, s is from 1 to 4 and t is from 0.5 to 10), and at least one activator selected from the group consisting of Eu and Dy. Moreover, the present invention provides the above-mentioned phosphor wherein the borate fluorescent material has the same crystal structure as that of Takedaite. The present invention also provides a white LED comprising any of the above-described fluorescent materials and light emitting diodes.

DETAILED DESCRIPTION OF THE PRESENT INVENTION

Figure 1:
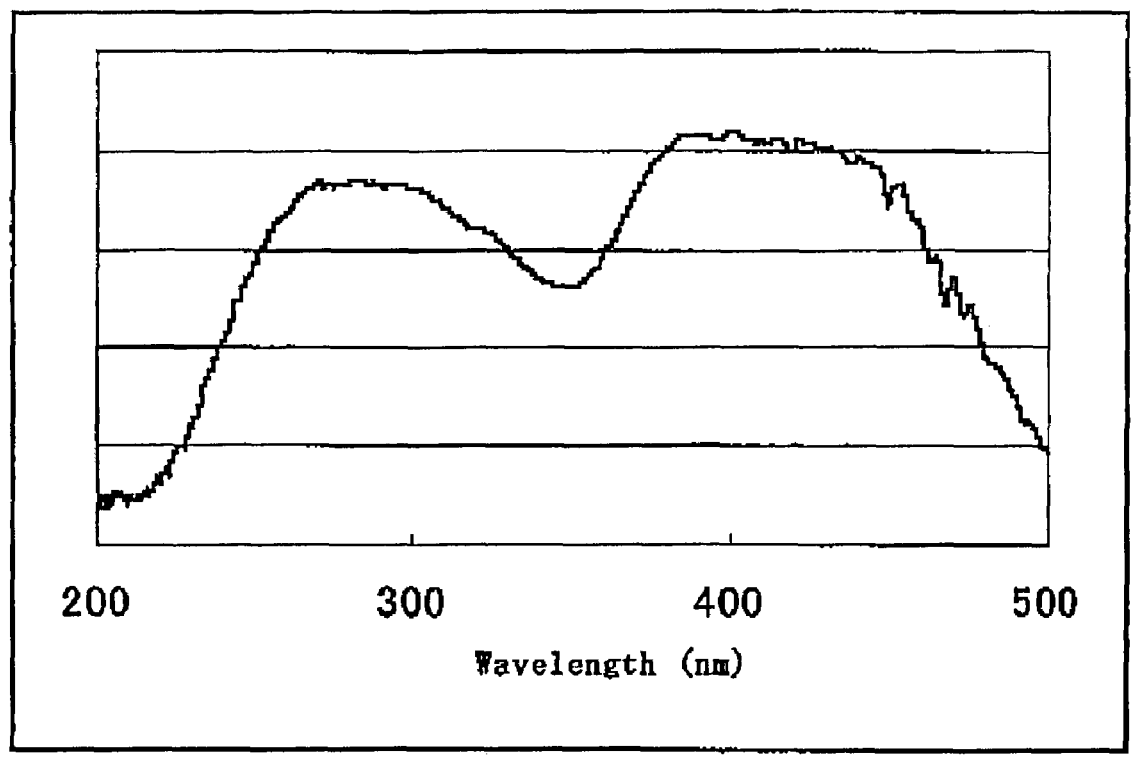
FIG. 1 shows an excitation spectrum of the phosphor for white LED: $(Ca_{0.99}Eu_{0.01})_2MgSi_2O_7$ of the present invention, obtained in the range from 200 nm to 500 nm at the peak of luminescence spectrum. The vertical axis shows the intensity of excitation and the unit is arbitrary.

The present invention is illustrated in detail below. The phosphor for white LED of the present invention comprises a silicate fluorescent material, a borate fluorescent material, or the mixture thereof.

The silicate fluorescent material is a crystal of a compound oxide containing Si and O. The silicate fluorescent material contains an activator as a metal element other than Si for acting as a fluorescent material. The borate fluorescent material is a crystal of a compound oxide containing B and O. The borate fluorescent material contains an activator as a metal element other than B for acting as a fluorescent material. The activator includes one or more metal elements selected from the group consisting of Ce, Pr, Nd, Pm, Sm, Eu, Tb, Dy, Ho, Er, Tm, Yb and Mn. As the metal element which may be contained other than the activator, listed are one or more metal elements selected from the group consisting of I (Li, Na, K, Rb), II (Be, Mg, Ca, Sr, Ba), III (Sc, Y), IV (Ti, Zr, Hf), XIII (B, Al, Ga, In), XIV (Ge, Sn) and XV (Sb, Bi) in the periodic table.

Preferable silicate fluorescent materials are silicate fluorescent materials comprising the composition represented by the formula (I):

$$mM^1O \cdot nM^2O \cdot 2SiO_2 \tag{I}$$

(wherein, $M^1$ represents at least one selected from the group consisting of Ca, Sr and Ba, $M^2$ represents at least one selected from the group consisting of Mg and Zn, m is from 0.5 to 2.5 and n is from 0.5 to 2.5), and at least one activator selected from the group consisting of Eu and Dy.

Among them, those having the same crystal structure as that of Akermanite are more preferable.

The preferable phosphor for white LED among the silicate fluorescent materials comprising the composition represented by the formula (I) is phosphor comprising a composition represented by formula (I), wherein m=2 and n=1, and Eu as an activator which replaces a part of $M^1$, that is, the composition represented by formula (II):

$$(M^1_{1-a}Eu_a)_2M^2Si_2O_7 \tag{II}$$

(wherein, $M^1$ and $M^2$ are as defined above, and a is from 0.0001 to 0.5). Another preferable phosphor for white LED is phosphor comprises above-mentioned composition represented by formula (II) and Dy as a co-activator.

Further preferable are fluorescent materials comprising the above-mentioned composition represented by formula (II) in which $M^2$ represents Mg, and Dy as co-activator, The preferable phosphor for white LED among the silicate fluorescent materials comprising the composition represented by the formula (I) is also fluorescence comprising a composition represented by formula (I), wherein m=1 and n=2, and Eu as an activator which replaces a part of $M^1$, that is, the composition represented by formula (III):

$$(M^1_{1-b}Eu_b)M^2_2Si_2O_7 \tag{III}$$

(wherein, $M^1$ and $M^2$ are as defined above, and b is from 0.0001 to 0.5). Another preferable phosphor for white LED is phosphor comprises above-mentioned composition represented by formula (III) and Dy as a co-activator.

Further preferable are fluorescent materials comprising the above-mentioned composition represented by formula (III) in which $M^2$ represents Mg, and Dy as co-activator.

Preferable borate fluorescent materials are borate fluorescent materials comprising the composition represented by the formula (IV):

$$sM^3O \cdot tB_2O_3 \tag{IV}$$

(wherein, $M^3$ represents at least one selected from the group consisting of Mg, Ca, Sr and Ba, s is from 1 to 4 and t is from 0.5 to 10), and at least one activator selected from the group consisting of Eu and Dy, from the viewpoint of its low intensity of the blue-green fluorescence having the wavelength of 480 nm.

Among them, those having the same crystal structure as that of Takedaite are more preferable.

The preferable phosphor for white LED among the borate fluorescent materials comprising the composition represented by the formula (IV) is also fluorescence comprising a composition represented by formula (V), wherein s=3 and t=1, and Eu as an activator which replaces a part of $M^1$:

$$(M^3_{1-c}Eu_c)_3B_2O_6 \tag{V}$$

In (V), wherein, $M^3$ is as defined above, and c is preferably from 0.0001 to 0.5, more preferably from 0.001 to 0.3, and further preferably from 0.005 to 0.2.

The phosphor for white LED of the present invention comprises a borate fluorescent material is preferable.

Next, a method for producing fluorescence of the present invention will be described.

The method for producing phosphor for white LED of the present invention is not particularly restricted, and it can be produced by firing a mixture of metal compounds which provides a silicate fluorescent material or a borate fluorescent material by firings.

The compounds of metal elements other than Si as raw materials for producing the phosphor of the present invention include compounds capable of being decomposed at high temperatures to become oxides, such as hydroxides, carbonates, nitrates, halides, oxalates and the like having high purity (99% or more), or oxides of high purity (99.9% or more).

As the Si compound, $SiO_2$ can be used, and compounds having a high purity of 99.9% or more and in the form of fine particle having an average particle size of 1 μm or less can be preferably used.

The compounds of metal elements including B (boron) as raw materials is weighted, mixed and fired to produce the phosphor of the present invention. For example, one of the preferable compound represented by $(Sr_{0.97}Eu_{0.03})_3B_2O_6$ is produced by the method where $SrCO_3$, $Eu_2O_3$ and $H_3BO_3$ as the raw materials are weighed and compounded to give a molar ratio Sr:Eu:B of 2.91:0.09:2, and then be fired. Metal compound other than boron compounds is used as raw materials capable of being decomposed at high temperatures to become oxides, such as hydroxides, carbonates, nitrates, halides, oxalates and the like having high purity (99% or more), or oxides of high purity (99.9% or more).

As the B compound, $H_3BO_3$ (purity: 95% or more), $B_2O_3$ (purity: 99% or more) can be used, and compounds having a high purity of 99.9% or more can be preferably used.

These raw materials may be mixed by usual and industrial method such as ball mills, V-shaped mixers, stirrers and the like.

The phosphor of the present invention is obtained by, after mixing, firing the mixture at temperatures from 1000° C. to 1500° C. for 1 to 100 hours. When compounds capable of being decomposed at high temperatures to become oxides, such as hydroxides, carbonates, nitrates, halides, oxalates and the like, are used, it is effective that calcination is performed at temperatures from 600° C. to 900° C. before the calcination.

The firing atmosphere is not particularly restricted, and for example, it is preferable to conduct calcination in a reducing atmosphere such as an atmosphere comprising inert gas such as nitrogen and argon and the like, and hydrogen in a proportion of 0.1 to 10 volume %. As the calcination atmosphere, either of an air atmosphere or reducing atmosphere maybe selected. For promoting the reaction, a suitable amount of flux may also be added.

Further, fluorescence obtained by the above-mentioned method may be ground by using, for example, a ball mill, jet mill and the like. Moreover, washing and classification may be conducted. For enhancing the crystallinity of the resulting phosphor, re-firing may also be conducted.

Since the phosphor of the present invention obtained as described above has a peak wavelength of excitation spectrum in the range of from 350 to 500 nm, it is excited efficiently with light in this wavelength range, to cause yellow color emission of which intensity of blue-green light having the wavelength of around 500 nm is low. Accordingly, the phosphor is preferably used for white LED.

As the light emitting diode emitting light of a wavelength of 350 to 500 nm which excites phosphor, light emitting diodes made of a nitride semiconductor are preferable. The nitride semiconductor is known as a semiconductor material having a band gap from 1.95 eV (InN) to 6.19 eV (AlN), and theoretically, light emission at from about 633 nm to 201 nm is possible (JP No. 11-191638A). The wavelength of emission from nitride semiconductor can be varied by the ratio of its constituent elements, and for example, the peak of light emission wavelength can be controlled in the rage from 320 to 450 nm in the case of the Ga—N type and in the range from 300 to 500 nm in the case of the In—Al—Ga—N type. As the light emitting element made of a nitride semiconductor include light emitting elements having a hetero structure or double hetero structure, in which the light emitting layer is made of a compound of the composition formula $In_xAl_yGa_{1-x-y}N$ (0<x, 0<y, x+y<1).

The white LED of the present invention can be produced by known methods such as disclosed in JP Nos. 5-152609A and 7-99345A and the like using the fluorescence of the present invention. The white LED of the present invention can be produced by dispersing the phosphor of the present invention in a transparent resin such as an epoxy resin, polycarbonate, silicon rubber and the like, and molding the resin containing the dispersed phosphor so that it surrounds a light emitting diode (compound semiconductor) on a stem. In the white LED of the present invention, a blue color emitting nitride semiconductor is preferable as the light emitting diode, and it is also possible to use a compound semiconductor emitting from ultraviolet to blue light.

Though the phosphor of the present invention can be used alone, it is also possible to produce a white LED showing higher whiteness by combination with other phosphor such as, for example, fluorescence emitting red light, fluorescence emitting green light and the like.

EXAMPLES

The present invention will be illustrated further in detail by examples below, but the scope of the invention is not limited to them.

Example 1

Figure 2:
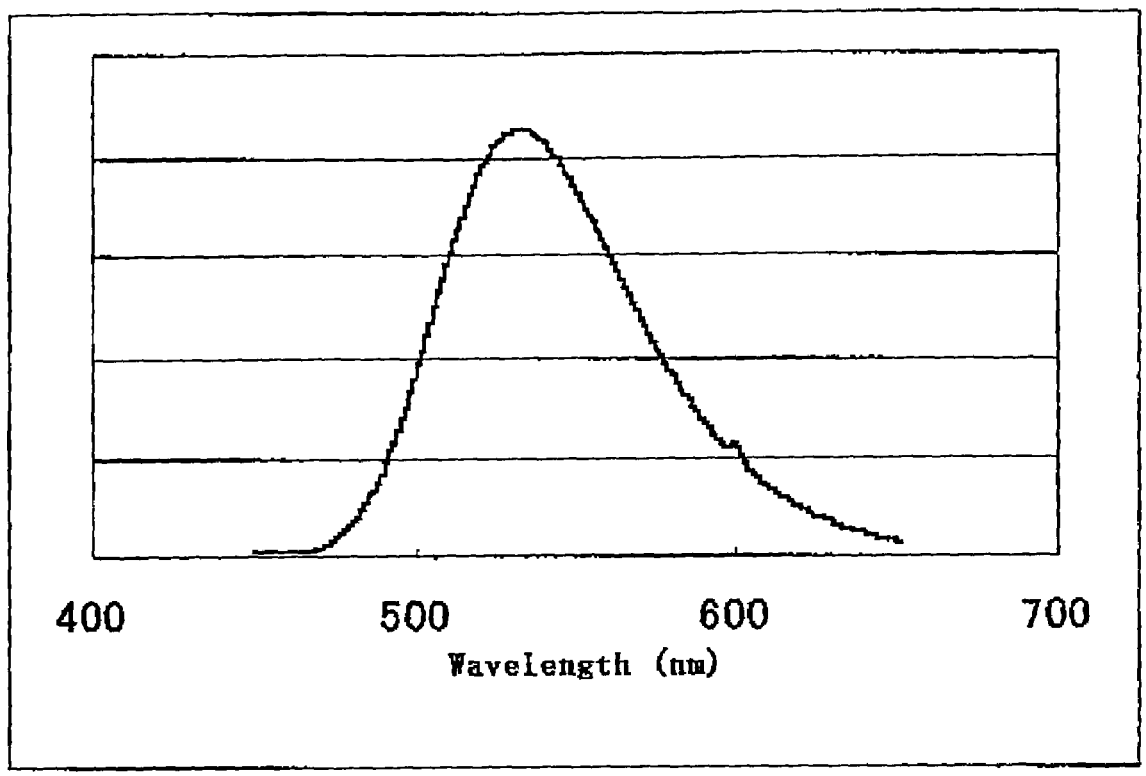
FIG. 2 shows a luminescence spectrum of the phosphor for white LED: $(Ca_{0.99}Eu_{0.01})_2MgSi_2O_7$ of the present invention when excited with light having a wavelength of 365 nm. The vertical axis shows the intensity of emission and the unit is arbitrary.

For producing $(Ca_{0.99}Eu_{0.01})_2MgSi_2O_7$, calcium carbonate $CaCO_3$, europium oxide $Eu_2O_3$, magnesium oxide MgO and silicon oxide $SiO_2$ were used as starting raw materials. These raw materials were compounded to give a molar ratio $CaCO_3:Eu_2O_3:MgO:SiO_2$ of 1.98:0.01:1:2, and 0.1 mol of $B_2O_3$ was added as a flux to 1 mol of the product $(Ca_{0.99}Eu_{0.01})_2MgSi_2O_7$, and acetone was added to this and these were sufficiently mixed under wet condition in a mortar, and the mixture was dried. The resulted raw material mixture was placed in a stainless mold, and pressed under a pressure of 40 MPa to mold it into circular pellets having a diameter of 15 mm and a thickness of 3 mm. The resulted pellets were charged in an alumina crucible, and fired at 1200° C. in a 5% $H_2$-95% Ar atmosphere for 3 hours to obtain fluorescence. The resulted fluorescence had an Akermanite crystal structure. The fluorescence obtained after firing was excited with ultraviolet ray of 254 nm or 365 nm, to show yellow light emission of high brilliance in each case. FIG. 1 shows an excitation spectrum and FIG. 2 shows an emission spectrum. The peak wavelength of the excitation spectrum was around 390 nm and the peak wavelength of the emission spectrum was around 530 nm. The intensity of the peak wavelength of the excitation spectrum having 480 nm was 8% of that of the peak wavelength of 530 nm.

On a blue light emitting element made of a nitride semiconductor, the resulted phosphor was applied and allowed to cause light emission, thus LED can be obtained which looks white by mixing of light from the nitride semiconductor and light from the phosphor.

The nitride semiconductor having a light emission layer of a composition $In_{0.3}Ga_{0.7}N$ and having a light emission peak at 450 nm was used. The nitride semiconductor was produced by a MOVPE (Metalorganic Vapor Phase Epitaxy) method using a TMG (trimethylgallium) gas, TEG (triethylgallium) gas, TMI (trimethylindium) gas, ammonia and dopant gas (silane ($SiH_4$) and cyclopentadienylmagnesium ($Cp_2Mg$)) on a washed sapphire substrate. An electrode was formed on this nitride semiconductor, to give a light emitting diode.

Example 2

Figure 3:
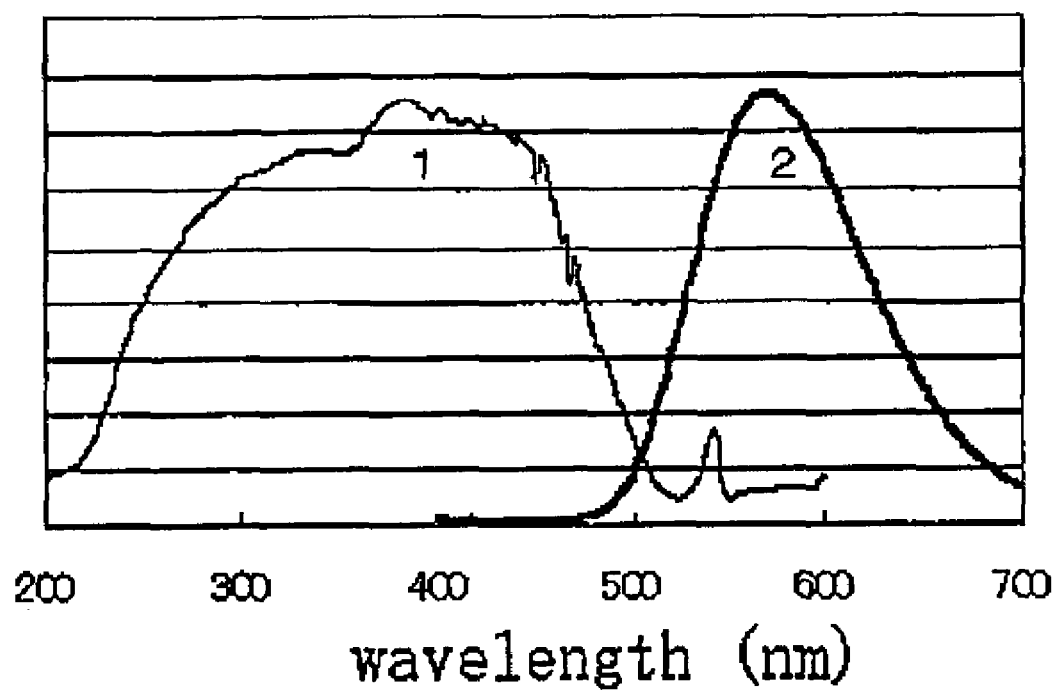
FIG. 3 shows a luminescence and excitation spectrum of the phosphor for white LED: $(Sr_{0.97}Eu_{0.03})_3B_2O_6$ of the present invention. The vertical axis shows the intensity of emission and the unit is arbitrary. The horizontal axis shows the wavelength and the unit is nm. 1 means the excitation spectrum monitored at 572 nm. 2 means emission spectrum excited at 382 nm.

For producing $(Sr_{0.97}Eu_{0.03})_3B_2O_6$, strontium carbonate $SrCO_3$, europium oxide $Eu_2O_3$, and boron oxide $H_3BO_3$ were used as starting raw materials. These raw materials were compounded to give a molar ratio Sr:Eu:B of 2.91:0.09:2, and 0.1 mol of $H_3BO2$ was added as a flux to 1 mol of the product $(Sr_{0.07}Eu_{0.03})_3B_2O_6$, and acetone was added to this and these were sufficiently mixed under wet condition in a mortar, and the mixture was dried. The resulted raw material mixture was placed in a stainless mold, and pressed under a pressure of 40 MPa to mold it into circular pellets having a diameter of 15 mm and a thickness of 3 mm. The resulted pellets were charged in an alumina crucible, maintained at 1000° C. in an air and fired at 1000° C. in a 5% $H_2$-95% Ar atmosphere for 10 hours toobtain fluorescence. The resulted fluorescence had a Takedaite crystal structure by X-ray analysis. The fluorescence obtained after firing was excited with ultraviolet ray of 254 nm or 365 nm, to show yellow light emission of high brilliance in each case. FIG. 3 shows an excitation spectrum. The peak wavelength of the excitation spectrum was around 380 nm and the peak wavelength of the emission spectrum was around 572 nm. The intensity of the peak wavelength of the excitation spectrum having 480 nm was 2% of that of the peak wavelength of 572 nm.

On a blue light emitting element made of a nitride semiconductor, the resulted phosphor was applied and allowed to cause light emission, thus LED can be obtained which looks white by mixing of light from the nitride semiconductor and light from the phosphor.

The nitride semiconductor having a light emission layer of a composition $In_{0.3}Ga_{0.7}N$ and having a light emission peak at 450 nm was used. The nitride semiconductor was produced by a MOVPE (Metalorganic Vapor Phase Epitaxy) method using a TMG (trimethylgallium) gas, TEG (triethylgallium) gas, TMI (trimethylindium) gas, ammonia and dopant gas (silane ($SiH_4$) and cyclopentadienylmagnesium ($Cp_2Mg$)) on a washed sapphire substrate. An electrode was formed on this nitride semiconductor, to give a light emitting diode.

The phosphor of the present invention is efficiently excited by light in the wavelength range of from 350 to 500 nm emitted by a blue light emitting diode and shows yellow light emission, and its intensity of blue- green light having wavelength of around 500 nm was low, therefore, it is suitable for a white LED, and a white LED obtained by using the fluorescence of the present invention shows high efficiency and has high brilliance, therefore, the present invention is extremely useful industrially.

What is claimed is:

1. A white LED comprising phosphor which comprises yellow-emitting calcium-included silicate fluorescence materials, and light emitting diodes,
   wherein the silicate fluorescent material comprises a composition represented by $mM^1O.nM^2O.2SiO_2$ ($M^1$ represents at least one selected from the group consisting of Ca, Sr and Ba, $M^2$ represents at least one selected from the group consisting of Mg and Zn, m is from 0.5 to 2.5 and n is from 0.5 to 2.5), and at least one activator selected from the group consisting of Eu and Dy.

2. A white LED comprising phosphor which comprises yellow-emitting calcium-included silicate fluorescence materials and light emitting diodes,
   wherein the silicate fluorescent material has the same crystal structure as that of calcium-included Akermanite.

3. The white LED according to claims 1 or 2, wherein the light emitting diodes are blue color emitting nitride semiconductors.

* * * * *